(12) United States Patent
Sakuma et al.

(10) Patent No.: US 9,306,177 B2
(45) Date of Patent: Apr. 5, 2016

(54) ORGANIC LIGHT-EMITTING LAYER MATERIAL, COATING LIQUID FOR USE IN FORMING ORGANIC LIGHT-EMITTING LAYER WITH ORGANIC MATERIAL, ORGANIC LIGHT-EMITTING DEVICE PRODUCED WITH COATING LIQUID, LIGHT SOURCE APPARATUS WITH ORGANIC LIGHT-EMITTING DEVICE, AND METHODS FOR MANUFACTURE THEREOF

(71) Applicant: Hitachi, Ltd., Tokyo (JP)

(72) Inventors: Hirotaka Sakuma, Tokyo (JP); Sukekazu Aratani, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/409,716

(22) PCT Filed: Jun. 3, 2013

(86) PCT No.: PCT/JP2013/065313
§ 371 (c)(1),
(2) Date: Dec. 19, 2014

(87) PCT Pub. No.: WO2013/190982
PCT Pub. Date: Dec. 27, 2013

(65) Prior Publication Data
US 2015/0194613 A1      Jul. 9, 2015

(30) Foreign Application Priority Data

Jun. 19, 2012   (JP) ................................ 2012-137405

(51) Int. Cl.
*H01L 29/08*      (2006.01)
*H01L 27/15*      (2006.01)
(Continued)

(52) U.S. Cl.
CPC .......... *H01L 51/0085* (2013.01); *C09K 11/025* (2013.01); *C09K 11/06* (2013.01);
(Continued)

(58) Field of Classification Search
CPC ............ H01L 51/5012; H01L 27/3244; H01L 27/1225; H01L 51/5056; H01L 27/124; H01L 51/5072; H01L 2251/5338; H01L 51/0052; H01L 51/0061; H01L 51/5092; G06F 3/04842; G09G 2320/0233; G09G 3/3208
USPC ......... 257/13, 40, 79, 80, 83, 84, 88–90, 102, 257/184, 189, 290, 291, 431, 432, 436, 257/444; 438/22–29, 34, 46–48, 57, 77, 93, 438/94
See application file for complete search history.

(56) References Cited

U.S. PATENT DOCUMENTS 8,062,767 B2 * 11/2011 Cheng et al. .................. 428/690
2002/0134984 A1   9/2002 Igarashi
(Continued)

FOREIGN PATENT DOCUMENTS

JP    09-063770 A    3/1997
JP    2003-133074 A  5/2003
(Continued)

OTHER PUBLICATIONS

Fu-Ming Hwang et al., Iridium(III) Complexes with Orthometalated Quinoxaline Ligands: Subtle Tuning of Emission to the Saturated Red Color, Inorganic Chemistry, US, American Chemical Society, Feb. 4, 2005, vol. 44, No. 5, 2005, p. 1344-1353.

*Primary Examiner* — Hsien Ming Lee
(74) *Attorney, Agent, or Firm* — Volpe and Koenig, P.C.

(57) ABSTRACT

An organic light-emitting device includes an upper electrode, a lower electrode, and a light-emitting layer disposed between the upper and lower electrodes, wherein the light-emitting layer includes a host and a first dopant. The first dopant includes a pyridyltriazole derivative as an auxiliary ligand, the auxiliary ligand of the first dopant contains a functional group R1 or a functional group R2, and the first dopant is displaced toward a surface of the light emitting layer by the action of at least one of the functional groups R1 and R2, wherein the surface is on a side where the upper electrode is present, and also directed to a coating liquid for use in forming the light-emitting layer with an organic material. An organic light-emitting device is produced with the coating liquid, a light source apparatus includes the organic light-emitting device, and methods for manufacture thereof are disclosed.

10 Claims, 1 Drawing Sheet

(51) Int. Cl.
    *H01L 29/24*      (2006.01)
    *H01L 31/062*     (2012.01)
    *H01L 21/00*      (2006.01)
    *H01L 51/00*      (2006.01)
    *C09K 11/06*      (2006.01)
    *H01L 51/50*      (2006.01)
    *C09K 11/02*      (2006.01)
    *H01L 51/56*      (2006.01)
    *H05B 33/14*      (2006.01)
    *H01L 51/52*      (2006.01)

(52) U.S. Cl.
    CPC ......... *H01L 51/009* (2013.01); *H01L 51/5016* (2013.01); *H01L 51/5036* (2013.01); *H01L 51/56* (2013.01); *H05B 33/14* (2013.01); *C09K 2211/1011* (2013.01); *C09K 2211/1029* (2013.01); *C09K 2211/1059* (2013.01); *C09K 2211/185* (2013.01); *H01L 51/5008* (2013.01); *H01L 51/5024* (2013.01); *H01L 51/5072* (2013.01); *H01L 51/5206* (2013.01); *H01L 51/5221* (2013.01); *H01L 2251/5346* (2013.01)

(56) References Cited

U.S. PATENT DOCUMENTS

| | | |
|---|---|---|
| 2006/0286404 A1 | 12/2006 | Wu |
| 2008/0217606 A1 | 9/2008 | Cheng et al. |
| 2009/0001875 A1 | 1/2009 | Chi et al. |
| 2011/0175066 A1 | 7/2011 | Sakuma et al. |
| 2012/0025177 A1* | 2/2012 | Yoon et al. ............... 257/40 |

FOREIGN PATENT DOCUMENTS

| | | |
|---|---|---|
| JP | 2011-151096 A | 8/2011 |
| JP | 2011-151097 A | 8/2011 |
| WO | 2010/090362 A1 | 8/2010 |
| WO | 2010-090362 A1 | 8/2010 |
| WO | 2013/174471 A1 | 11/2013 |

* cited by examiner

ORGANIC LIGHT-EMITTING LAYER MATERIAL, COATING LIQUID FOR USE IN FORMING ORGANIC LIGHT-EMITTING LAYER WITH ORGANIC MATERIAL, ORGANIC LIGHT-EMITTING DEVICE PRODUCED WITH COATING LIQUID, LIGHT SOURCE APPARATUS WITH ORGANIC LIGHT-EMITTING DEVICE, AND METHODS FOR MANUFACTURE THEREOF

TECHNICAL FIELD

The present invention relates to an organic light-emitting layer material, a coating liquid for use in forming an organic light-emitting layer with the organic material, an organic light-emitting device produced with the coating liquid, a light source apparatus including the organic light-emitting device, and methods for manufacture thereof.

BACKGROUND ART

Methods for manufacturing organic light-emitting diodes (LEDs) are broadly divided into vacuum deposition methods and coating methods. Among them, coating methods have advantages such as easiness of large-area film formation and high material-use efficiency. When a coating method is to be used to form an organic LED, it is required that the number of layers in the organic LED is smaller, and its light-emitting layer is a single-layer structure.

PTL 1 has reported, as an organic, white light-emitting device, a single layer-type white light-emitting organic EL device including electrodes and a light-emitting layer with a single-layer structure disposed between the electrodes. In this light-emitting device, the light-emitting layer includes a composition including at least (a) a polymer and (b) emission center-forming compounds. This composition contains an electron-transporting material and a hole-transporting material in a good balance. The polymer emits blue light or light with a wavelength shorter than blue. Molecules of two or more of the emission center-forming compounds are dispersed in the polymer. Each emission center-forming compound emits light by itself. The two or more emission center-forming compounds are used in combination so that light beams emitted from the whole of the organic EL device appear white. Besides PTL 1, related published literatures include PTL 2 and PTL 3.

CITATION LIST

Patent Literatures

PTL 1: JP 09-63770 A
PTL 2: JP 2011-151096 A
PTL 3: JP 2011-151097 A

SUMMARY OF INVENTION

Technical Problem

The luminous efficiency of the conventional organic light-emitting device can insufficient because a satisfactory auxiliary ligand is not used in the light-emitting dopant of the conventional device.

It is an object of the present invention to increase the luminous efficiency of organic light-emitting devices.

Solution to Problem

To solve the problem, the present invention typically has the following features. An organic light-emitting device including an upper electrode, a lower electrode, and a light-emitting layer disposed between the upper electrode and the lower electrode, wherein the light-emitting layer includes a host and a first dopant, the first dopant includes a pyridyltriazole derivative as an auxiliary ligand, the auxiliary ligand of the first dopant contains a functional group $R_1$ or a functional group $R_2$, and the first dopant is displaced toward a surface of the light emitting layer by the action of at least one of the functional groups $R_1$ and $R_2$, wherein the surface is on a side where the upper electrode is present; a coating liquid for use in forming the light-emitting layer with an organic material; an organic light-emitting device produced with the coating liquid; a light source apparatus including the organic light-emitting device; and methods for manufacture thereof.

Advantageous Effects of Invention

The present invention makes it possible to increase the luminous efficiency of organic light-emitting devices. Other objects, features, and advantageous effects will be apparent from embodiments described below.

DESCRIPTION OF EMBODIMENTS

Hereinafter, the present invention will be described in detail with reference to the drawings and the like. The following detailed description shows embodiments of the concept of the present invention by way of illustration only and is not intended to limit the present invention. It will be understood that those skilled in the art can make a variety of changes and modifications to the embodiments within the technical scope disclosed herein.

An organic light-emitting device manufactured using the conventional coating method has a green dopant concentration of 0.02 mol % and red dopant concentrations of 0.02 mol % and 0.015 mol %, which are very low in order to suppress energy transfer from a blue dopant, so that the dopant concentration is difficult to control. In such an organic light-emitting device, energy transfer between the dopants and confinement of carriers in the light-emitting resin are also insufficient, so that the resulting luminous efficiency is insufficient.

<Organic Light-Emitting Device>

Figure 1:
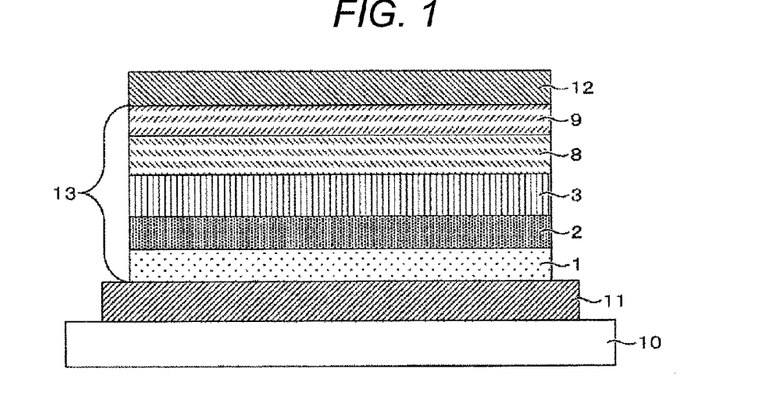
FIG. 1 is a cross-sectional view of an organic light-emitting device according to an embodiment of the present invention.

FIG. 1 is a cross-sectional view of an organic light-emitting device according to an embodiment of the present invention. The organic light-emitting device has an upper electrode 12, a lower electrode 11, and an organic layer 13. As viewed from the bottom side of FIG. 1, a substrate 10, the lower electrode 11, the organic layer 13, and the upper electrode 12 are disposed in this order. The organic light-emitting device of FIG. 1 is of a bottom emission type, in which the emission from a light-emitting layer 3 is extracted from the lower electrode 11 side. The lower electrode 11 is a transparent electrode acting as an anode, and the upper electrode 12 is a reflective electrode acting as a cathode. Alternatively, if the upper and lower electrodes 12 and 11 are used as a cathode and an anode, respectively, the device structure may be of a top emission type in which the upper electrode 12 is a transparent electrode. The substrate 10 and the lower electrode 11, the lower electrode 11 and the organic layer 13, or the organic layer 13 and the upper electrode 12 may be in contact with each other, or an additional layer may be interposed between each pair of layers. The additional layer may be an inorganic buffer layer, an injection layer, or the like. The buffer layer may include vanadium oxide, molybdenum oxide, tungsten oxide, or the like.

The organic layer 13 may be either a single-layer structure consisting of a light-emitting layer 3 or a multilayer structure including a light-emitting layer 3 and at least one of an electron injection layer 9, an electron transport layer 8, a hole transport layer 2, and a hole injection layer 1. The electron injection layer 9 and the electron transport layer 8, the electron transport layer 8 and the light-emitting layer 3, the light-emitting layer 3 and the hole transport layer 2, or the hole transport layer 2 and the hole injection layer 1 may be in contact with each other, or the organic buffer layer or the injection layer may be interposed between each pair of layers. The organic light-emitting device of FIG. 1 is provided with a driving circuit, a housing, and other parts to form a light source apparatus. In the process of forming the light-emitting layer 3 of the organic layer 13, an already-formed electrode is used as the lower electrode 11, and the upper electrode 12 is formed after the formation of the light-emitting layer 3. When the light-emitting layer 3 is formed, the lower electrode 11 or an organic layer to be an underlayer on which the light-emitting layer 3 is formed is present on the side where the lower electrode 11 is formed with respect to the light-emitting layer 3.

<Light Source Apparatus>

Figure 2:
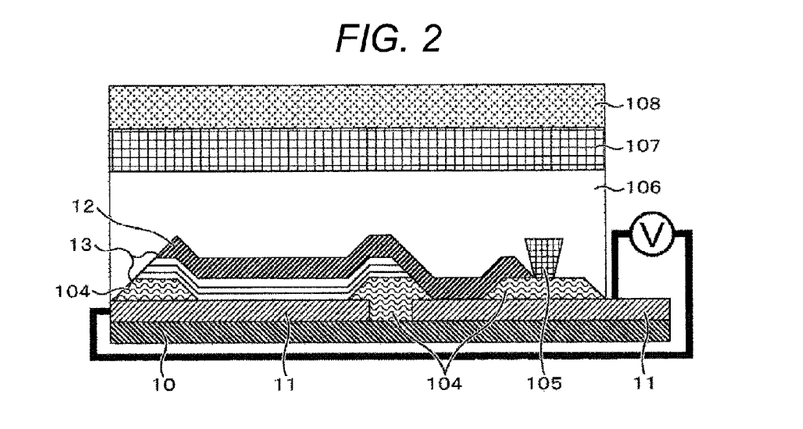
FIG. 2 is a cross-sectional view of a light source apparatus according to an embodiment of the present invention.

FIG. 2 is a cross-sectional view of a light source apparatus according to an embodiment of the present invention. FIG. 2 shows a top emission type organic light-emitting device, in which emission is extracted from the upper electrode 12 side. In FIG. 8, a lower electrode 11, a first bank 104, a second bank 105, an organic layer 13, an upper electrode 12, a resin layer 106, a sealing substrate 107, and a light extraction layer 108 are disposed in this order on a substrate 10. In the case of a bottom emission type organic light-emitting device, the light extraction layer 108 is disposed on a side opposite to the side of the substrate 10 where the organic layer 13 is not present.

The first bank 104, which is forward tapered, serves as a cover for the edge of the patterned lower electrode 11. The second bank 105, which is reverse tapered, serves to separate the organic layer 13 and the upper electrode 12 from those of an adjacent device. The first bank 104 and second bank 105 may be made of any of various resins such as polyimide resin, acrylic resin, novolac resin, and phenolic resin. The first bank 104 and second bank 105 are formed through exposure with a given photomask and development after the organic layer 13 is formed by a coating process. The surfaces of the first bank 104 and second bank 105 may be subjected to a water-repellent treatment. For example, the water-repellent treatment is performed in such a way that the surfaces of the first bank 104 and second bank 105 are subjected to a plasma treatment with fluorine-based gas so that the surfaces of the first bank 104 and second bank 105 are fluorinated.

The resin layer 106 and the sealing substrate 107 serve to protect the organic light-emitting device from infiltration of gas or water, which is a factor of degradation of the device. The light extraction layer 108 enables efficient extraction of light emitted from the light-emitting layer 3.

<Light-Emitting Layer>

The light-emitting layer 3 includes a host and a light-emitting dopant. The light-emitting layer 3 is a layer that emits light upon recombination of electrons and holes, which are injected from the upper electrode 12 or the electron transport layer 8 and the lower electrode 11 or the hole transport layer 2. The light-emitting part may be inside the light-emitting layer 3 or at the interface between the light-emitting layer 3 and a layer adjacent thereto.

The light-emitting dopant may be any of fluorescent compounds, phosphorescent compounds, and the like. The term "light-emitting dopant" includes red, green, and blue dopants. Materials used to form the light-emitting layer 3 include a host, a red dopant, a green dopant, and a blue dopant. Alternatively, materials used to form the light-emitting layer 3 may be as follows.

(1) The materials include a host, a red dopant, and a blue dopant.

(2) The materials include a host, a red dopant, and a green dopant.

(3) The materials include a host, a green dopant, and a blue dopant.

Red, green, and blue dopants have different emission colors. The term "different emission colors" means that the PL spectra of these dopants have different maximum-intensity wavelengths. In the light-emitting layer 3, the light-emitting dopants are localized in regions near the surface of the light-emitting layer 3 and form a pseudo laminated structure.

<Phase Separation>

Methods for manufacturing organic light-emitting devices are broadly divided into vacuum deposition methods and coating methods. Among them, coating methods have advantages such as easiness of large-area film formation and high material-use efficiency. If a coating method is to be used to form the organic light-emitting device, it is required that the number of layers in the organic light-emitting device is smaller, and the light-emitting layer 3 is a single-layer structure.

Red, green, and blue dopants may be mixed to allow the light-emitting layer 3 with a single-layer structure to emit white light. In this case, one dopant can be surrounded by other different-color dopants in the light-emitting layer 3. Excitation energy transfers with a certain probability to adjacent molecules. For example, when a green or red dopant molecule is adjacent to a blue dopant molecule, excitation energy will transfer from the blue dopant molecule to the green or red dopant molecule (the lower energy side), which can make white-light emission difficult. The excitation energy transfer can occur not only when the light-emitting layer 3 with a single-layer structure contains dopants of three colors but when it contains dopants of two colors. For example, if the light-emitting layer 3 with a single-layer structure contains green and red dopants, energy can transfer from the green dopant to the red dopant (lower energy side), which can make white-light emission difficult. Therefore, the dopants are designed to spontaneously form separate phases in the light-emitting layer 3 so that one dopant molecule is prevented from being adjacent to another lower-energy dopant molecule. This allows even a coating-type organic white light-emitting device to emit white light with high efficiency. In this case, white-light emission can be produced even at high dopant concentrations. In an embodiment of the present invention, as a technique for the spontaneous phase separation, a suitable functional group is added to the light-emitting dopant. To suppress the energy transfer effectively, it is preferable to add a functional group to a light-emitting dopant whose excitation energy is lower (emission wavelength is longer) so that it can be localized. If a light-emitting dopant is localized at one surface of the light-emitting layer, an organic layer at another side could be used as a charge blocking layer or an electron blocking layer.

<Coating Liquid>

Materials for use in forming the light-emitting layer 3 are dissolved in a suitable solvent to form a coating liquid. Hereinafter, cases where materials used to form the light-emitting layer 3 include a host and red, green, and blue dopants will be described.

The solvent to be used may be, for example, an aromatic hydrocarbon solvent such as toluene, an ether solvent such as tetrahydrofuran, an alcohol, a fluoride solvent, or any other solvent capable of dissolving each material. The solvent may also be a mixed solvent that is prepared by mixing two or more of the solvents listed above for the purpose of providing a certain solubility for each material or controlling its drying rate. The solubility in the solvent can be measured by liquid chromatography.

The coating method for forming the light-emitting layer 3 can be spin coating, casting, dip coating, spray coating, screen printing, inkjet printing, or the like. Anyone of these methods may be used to form the light-emitting layer 3.

<Host>

A carbazole derivative, a fluorene derivative, an arylsilane derivative, or the like is preferably used as the host. In order to achieve highly efficient emission, it is preferable to set the excitation energy of the host sufficiently higher than that of the blue dopant. The excitation energy is measured using a PL spectrum.

<Light-Emitting Dopant Localized at the Surface of Light-Emitting Layer>

The light-emitting dopant includes a pyridyltriazole derivative as an auxiliary ligand, and the auxiliary ligand of the light-emitting dopant has a specific functional group, so that the light-emitting dopant is displaced toward the upper electrode-side surface of the light-emitting layer, which allows the organic light-emitting device to have higher luminous efficiency. For example, during the process of forming the light-emitting layer 3, a light-emitting dopant represented by formula 1 is displaced toward the upper electrode-side surface of the light-emitting layer 3 by the action of the functional group $R_1$ or $R_2$ added to the light-emitting dopant. In the thicknesswise direction of the light-emitting layer 3, therefore, the concentration of the light-emitting dopant added with the functional group $R_1$ or $R_2$ reaches a peak at a location shifted from the center of the light-emitting layer toward its surface. In the thicknesswise direction of the light-emitting layer 3, the concentration of the light-emitting dopant monotonously decreases from the location where the concentration of the light-emitting dopant reaches a peak to the side opposite the surface of the light-emitting layer 3.

The light-emitting dopant added with the functional group $R_1$ or $R_2$ may be any of red, blue, and green dopants. In order to suppress the energy transfer effectively, the functional group $R_1$ or $R_2$ is preferably added to a green or red dopant whose excitation energy is lower (emission wavelength is longer), more preferably added to a red dopant.

[Chemical Formula 1]

(Formula 1)

In formula 1, Ar1 and Ar2 each represent an aromatic hydrocarbon ring or an aromatic heterocyclic ring. The aromatic heterocyclic ring may be, for example, a quinoline ring, an isoquinoline ring, a pyridine ring, a quinoxaline ring, a thiazole ring, a pyrimidine ring, a benzothiazole ring, an oxazole ring, a benzoxazole ring, an indole ring, an isoindole ring, an imidazole ring, a phenylbenzimidazole ring, a thienopyridine ring, a thiophene ring, a benzothiophene ring, a furan ring, a benzofuran ring, a fluorene ring, or the like. These rings may be substituted with a halogen element, an aryl group, an alkyl group, a substituted aryl group, a substituted alkyl group, or other moieties. The aromatic hydrocarbon ring may be a benzene ring, a naphthalene ring, an anthracene ring, or the like. These rings may be substituted with a halogen element, an aryl group, an alkyl group, a substituted aryl group, a substituted alkyl group, or other moieties. The emission color of the light-emitting dopant can be controlled by selecting the combination of Ar1 and Ar2. The blue dopant is preferably difluorophenylpyridine, bistrifluoromethylphenylpyridine, or the like. The green dopant is preferably phenylpyridine, 1,2-diphenyl-1H-benzimidazole. The red dopant is preferably phenylquinoline, phenylisoquinoline, benzothienylpyridine, or the like.

In formula 1, element M represents any element in Group 8, 9, or 10 of the periodic table. The element M is preferably Ir in view of the luminescent properties of the light-emitting dopant.

In the dopant of formula 1, the auxiliary ligand is a pyridyltriazole derivative. The pyridyltriazole derivative used as the auxiliary ligand in the dopant of formula 1 can produce a higher quantum efficiency than a acetylacetonate derivative.

The functional group $R_2$ may be, for example, a fluoroalkyl group, a perfluoroalkyl group, an alkyl group (having 8 or more carbon atoms), a perfluoropolyether group, or a siloxy group (—Si—O—Si). One of these functional groups may be used alone as the functional group $R_2$, or two or more of these functional groups may be used as the functional group $R_2$. In view of surface energy, a fluoroalkyl group or a perfluoroalkyl group is preferred, and a perfluoroalkyl group is more preferred. The functional group $R_2$ may be introduced directly to the main skeleton. Alternatively, the functional group $R_2$ may be introduced to the main skeleton with an alkylene group (such as a methylene group), a phenyl group, an ether group, or other groups interposed therebetween for the purpose of controlling the state of electrons in the auxiliary ligand.

The functional group $R_1$ may be unsubstituted (or hydrogen). On the other hand, the functional group $R_1$ may be a functional group for acting to displace the dopant toward the surface like the functional group $R_2$ or an electron-withdrawing group (such as a halogen element) for controlling the state of electrons. The functional group $R_2$ may be unsubstituted (or hydrogen) instead of being a fluoroalkyl group. In this case, only the functional group $R_1$ may be a functional group for acting to displace the light-emitting dopant toward the upper electrode-side surface, such as a fluoroalkyl group.

When the light-emitting layer 3 contains light-emitting dopants of two or more different colors, at least one of the light-emitting dopants may be represented by formula 1, or two or more of them may be represented by formula 1.

When two or more of the light-emitting dopants of two or more different colors are represented by formula 1, good white-light emission can be achieved. For example, when the two light-emitting dopants of formula 1 are red and green dopants, high-intensity blue emission can be achieved without any need to use extremely low dopant concentrations, so that good white-light emission can be achieved. When the light-emitting layer 3 contains red, green, and blue light-emitting dopants, dopants whose excitation energy is lower, specifically, the red and green dopants are preferably represented by formula 1.

<Blue Dopant>

Now, a description will be given of the blue dopant not added with the functional group $R_1$ or $R_2$, which acts to displace the dopant toward the surface of the light-emitting layer 3 being formed. The blue dopant has a maximum PL spectrum intensity, for example, at a wavelength between 400 nm and 500 nm at room temperature (25° C.). Examples of the main skeleton of the blue dopant include perylene and an iridium complex (such as bis(3,5-difluoro-2-(2-pyridyl)phenyl-(2-carboxypyridyl)iridium(III) (FIrpic)). In particular, an iridium complex represented by formula 2 is more preferred in view of luminescent properties. In formula 2, X1 represents a N-containing aromatic heterocyclic ring, and X2 represents an aromatic hydrocarbon ring or an aromatic heterocyclic ring.

[Chemical Formula 2]

(Formula 2)

The aromatic heterocyclic ring represented by X1 may be a quinoline ring, an isoquinoline ring, a pyridine ring, a quinoxaline ring, a thiazole ring, a pyrimidine ring, a benzothiazole ring, an oxazole ring, a benzoxazole ring, an indole ring, an isoindole ring, or the like.

The aromatic hydrocarbon ring or the aromatic heterocyclic ring represented by X2 may be a benzene ring, a naphthalene ring, an anthracene ring, a thiophene ring, benzothiophene ring, a furan ring, a benzofuran ring, a fluorene ring, an imidazole ring, or the like. These rings may be substituted with a halogen element, an aryl group, an alkyl group, a substituted aryl group, a substituted alkyl group, or other moieties.

In formula 2, X3 may be an acetylacetonate derivative, a picolinate derivative, a tetrakispyrazolylborate derivative, or the like. X3 may be the same as X1-X2.

<Green Dopant>

Now, a description will be given of the green dopant not added with the functional group $R_1$ or $R_2$, which acts to displace the dopant toward the surface of the light-emitting layer 3 being formed. The green dopant has a maximum PL spectrum intensity, for example, at a wavelength between 500 nm and 590 nm at room temperature. Examples of the main skeleton of the green dopant include coumarin, a derivative thereof, and an iridium complex (such as tris(2-phenylpyridine)iridium(III) (hereinafter referred to as Ir(ppy)3). In particular, an iridium complex represented by formula 2 is more preferred in view of luminescent properties.

<Red Dopant>

Now, a description will be given of the red dopant not added with the functional group $R_1$ or $R_2$, which acts to displace the dopant toward the surface of the light-emitting layer 3 being formed. The red dopant has a maximum PL spectrum intensity, for example, at a wavelength between 590 nm and 780 nm at room temperature. Examples of the main skeleton of the red dopant include rubrene, (E)-2-(2-(4-(dimethylamino)styryl)-6-methyl-4H-pyran-4-ylidene)malononitrile (DCM), a derivative thereof, an iridium complex (such as bis(1-phenylisoquinoline)(acetylacetonate)iridium(III)), an osmium complex, and a europium complex. In particular, an iridium complex represented by formula 2 is more preferred in view of luminescent properties.

<Hole Injection Layer>

The hole injection layer 1 is used to increase the luminous efficiency or the life. The hole injection layer 1 may be used, but not necessarily, to reduce the irregularities of the anode. The hole injection layer 1 may have a single-layer structure or a multilayer structure. The hole injection layer 1 preferably includes an electrically-conductive polymer such as poly(3, 4-ethylenedioxythiophene)-poly(styrenesulfonate) (PEDOT-PSS). Other polymer materials such as polypyrroles and triphenylamines can also be used Phthalocyanine compounds and star-burst amine compounds may also be used, which are often used in combination with low-molecular-weight materials (with a weight average molecular weight of 10,000 or less).

<Hole Transport Layer>

The hole transport layer 2 includes a material having the function of transporting holes. In a broad sense, the hole transport layer may also include a hole injection layer and an electron blocking layer. The hole transport layer 2 may have a single-layer structure or a multilayer structure. Any of star-burst amine compounds, stilbene derivatives, hydrazone derivatives, and thiophene derivatives may be used to form the hole transport layer 2. It will be understood that these materials are non-limiting and two or more of these materials may also be used in combination.

<Electron Transport Layer>

The electron transport layer 8 is a layer adapted to supply electrons to the light-emitting layer 3. In a broad sense, the electron transport layer 8 may also include the electron injection layer 9 and a hole blocking layer. The electron transport layer 8 may have a single-layer structure or a multilayer structure. Examples of the material that may be used to form the electron transport layer 8 include bis(2-methyl-8-quinolinolato)-4-(phenylphenolato)aluminum (hereinafter referred to as BAlq), tris(8-quinolinolato)aluminum (hereinafter referred to as Alq3), tris(2,4,6-trimethyl-3-(pyridin-3-yl)phenyl)borane (hereinafter referred to as 3TPYMB), 1,4-bis(triphenylsilyl)benzene (hereinafter referred to as UGH2), oxadiazole derivatives, triazole derivatives, fullerene derivatives, phenanthroline derivatives, and quinoline derivatives.

<Electron Injection Layer>

The electron injection layer 9 increases the efficiency of electron injection from the cathode to the electron transport layer 8. Specifically, the electron injection layer 9 preferably includes lithium fluoride, magnesium fluoride, calcium fluoride, strontium fluoride, barium fluoride, magnesium oxide, or aluminum oxide. It will also be understood that these materials are non-limiting and two or more of these materials may be used in combination.

<Substrate>

The substrate 10 may be a glass substrate, a metal substrate, or a plastic substrate on which an inorganic material such as $SiO_2$, $SiN_x$, or $Al_2O_3$ is formed. The metal substrate may be made of an alloy such as stainless steel or alloy 42. The plastic substrate may be made of polyethylene terephthalate, polyethylene naphthalate, polymethyl methacrylate, polysulfone, polycarbonate, polyimide, or the like.

<Anode>

The anode may be made of any material having transparency and a high work function. Examples of such a material include electrically-conductive oxides such as ITO and IZO and metals having high work functions, such as thin Ag materials. The electrode can be generally patterned on a substrate such as a glass substrate using photolithography and other processes.

<Cathode>

The cathode is a reflective electrode made of a material for reflecting light from the light-emitting layer 3. Specifically, a laminated body of LiF and Al, an Mg—Ag alloy, or the like is preferably used to form the cathode. It will be understood that these materials are non-limiting and, for example, a Cs compound, a Ba compound, a Ca compound, or the like may be used instead of LiF.

Hereinafter, the present invention will be more specifically described with reference to specific examples.

<Synthesis of Ir(pq)2F7taz>

First, a compound of formula 3 (Ir(pq)2F7taz) as a red dopant was synthesized for the preparation of an organic white light-emitting device according to an example of the present example.

[Chemical Formula 3]

(Formula 3)

A compound of formula 4 as an intermediate necessary for the synthesis of the compound of formula 3 was synthesized according to the following procedure. A 30 ml ethoxyethanol solution of 0.718 g of 2-phenylquinoline and a 10 ml water solution of 0.418 g of iridium chloride were added to a 200-ml three-necked flask and mixed. Subsequently, the mixture was refluxed at 120° C. for 12 hours under a nitrogen atmosphere and then cooled to room temperature. Water was added to the solution to quench the reaction. The solution was then filtered. The resulting solid was washed with hexane to give a compound of formula 4.

[Chemical Formula 4]

(Formula 4)

The compound of formula 3 was synthesized according to the following procedure. To a 200-ml three-necked flask were added 0.162 g of the compound of formula 4, 0.1 g of fluoroalkyl-substituted pyridyltriazole derivative, 0.07 g of sodium carbonate, and 10 ml of ethoxyethanol, and refluxed at room temperature for 10 hours under a nitrogen atmosphere. Water was then added to the solution. The solution was filtered, and the resulting solid was washed with hexane. The solid was subjected to silica gel column chromatography with an ethyl acetate/hexane mixed solvent as a developing solvent to give the compound of formula 3. The compound of formula 3 was dissolved in toluene, and the PL spectrum of the solution was measured using excitation ultraviolet light with a wavelength of 335 nm. The measurement showed red emission with a peak wavelength of 573 nm.

<Synthesis of Ir(piq)2F7taz>

First, a compound of formula 5 (Ir(piq)2F7taz) as a red dopant was synthesized for the preparation of an organic white light-emitting device according to an example of the present example.

[Chemical Formula 5]

(Formula 5)

A compound of formula 6 as an intermediate necessary for the synthesis of the compound of formula 5 was synthesized according to the following procedure. To a 200-ml three-necked flask were added 0.718 g of 1-phenylisoquinoline and 0.418 g of iridium chloride. A mixed solvent of 2-ethoxyethanol and water (3:1) was then added and mixed. Subsequently, the mixture was refluxed at 120° C. for 12 hours under a nitrogen atmosphere and then cooled to room temperature. Water was added to the solution to quench the reaction. The solution was then filtered. The resulting solid was washed with hexane to give a compound of formula 6.

[Chemical Formula 6]

(Formula 6)

The compound of formula 5 was synthesized according to the following procedure. To a 200-ml three-necked flask were added 0.162 g of the compound of formula 6, 0.1 g of a fluoroalkyl-substituted pyridyltriazole derivative, 0.07 g of sodium carbonate, and 10 ml of ethoxyethanol, and refluxed at room temperature for 10 hours under a nitrogen atmosphere. Water was then added to the solution. The solution was filtered, and the resulting solid was washed with hexane. The solid was subjected to silica gel column chromatography with an ethyl acetate/hexane mixed solvent as a developing solvent to give the compound of formula 5. The compound of formula 5 was dissolved in toluene, and the PL spectrum of the solution was measured using excitation ultraviolet light with a wavelength of 335 nm. The measurement showed red emission with a peak wavelength of 598 nm.

<Synthesis of Ir(ppy)2F7taz>

First, a compound of formula 7 (Ir(ppy)2F7taz) as a green dopant was synthesized for the preparation of an organic white light-emitting device according to an example of the present example.

[Chemical Formula 7]

(Formula 7)

A compound of formula 8 as an intermediate necessary for the synthesis of the compound of formula 7 was synthesized according to the following procedure. To a 200-ml three-necked flask were added 0.543 g of 2-phenylpyridine and 0.418 g of iridium chloride. A mixed solvent of 2-ethoxyethanol and water (3:1) was then added and mixed. Subsequently, the mixture was refluxed at 120° C. for 12 hours under a nitrogen atmosphere and then cooled to room temperature. Water was added to the solution to quench the reaction. The solution was then filtered. The resulting solid was washed with hexane to give a compound of formula 8.

[Chemical Formula 8]

(Formula 8)

The compound of formula 7 was synthesized according to the following procedure. To a 200-ml three-necked flask were added 0.136 g of the compound of formula 8, 0.1 g of fluoroalkyl-substituted pyridyltriazole derivative, 0.07 g of sodium carbonate, and 10 ml of ethoxyethanol, and refluxed at room temperature for 10 hours under a nitrogen atmosphere. Water was then added to the solution. The solution was filtered, and the resulting solid was washed with hexane. The solid was subjected to silica gel column chromatography with an ethyl acetate/hexane mixed solvent as a developing solvent to give the compound of formula 7. The compound of formula 7 was dissolved in toluene, and the PL spectrum of the solution was measured using excitation ultraviolet light with a wavelength of 335 nm. The measurement showed green emission with a peak wavelength of 488 nm.

<Synthesis of Ir(F2ppy)2F7taz>

First, a compound of formula 9 (Ir(F2ppy)2F7taz) as a blue dopant was synthesized for the preparation of an organic white light-emitting device according to an example of the present example.

[Chemical Formula 9]

(Formula 9)

A compound of formula 10 as an intermediate necessary for the synthesis of the compound of formula 9 was synthesized according to the following procedure. To a 200-ml three-necked flask were added 0.669 g of 2-(2,4-difluorophenyl)pyridine and 0.418 g of iridium chloride. A mixed solvent of 2-ethoxyethanol and water (3:1) was then added and mixed. Subsequently, the mixture was refluxed at 120° C. for 12 hours under a nitrogen atmosphere and then cooled to room temperature. Water was added to the solution to quench the reaction. The solution was then filtered. The resulting solid was washed with hexane to give a compound of formula 10.

[Chemical Formula 10]

(Formula 10)

The compound of formula 9 was synthesized according to the following procedure. To a 200-ml three-necked flask were added 0.155 g of the compound of formula 10, 0.1 g of a fluoroalkyl-substituted pyridyltriazole derivative, 0.07 g of sodium carbonate, and 10 ml of ethoxyethanol, and refluxed at room temperature for 10 hours under a nitrogen atmosphere. Water was then added to the solution. The solution was filtered, and the resulting solid was washed with hexane. The solid was subjected to silica gel column chromatography with an ethyl acetate/hexane mixed solvent as a developing solvent to give the compound of formula 9. The compound of formula 9 was dissolved in toluene, and the PL spectrum of the solution was measured using excitation ultraviolet light with a wavelength of 335 nm. The measurement showed blue emission with a peak wavelength of 458 nm.

<Synthesis of Ir(pbi)2F7taz>

First, a compound of formula 11 (Ir(pbi)2F7taz) as a green dopant was synthesized for the preparation of an organic white light-emitting device according to an example of the present invention.

[Chemical Formula 11]

(Formula 11)

A compound of formula 12 as an intermediate necessary for the synthesis of the compound of formula 11 was synthesized according to the following procedure. To a 200-ml three-necked flask were added 0.946 g of 1,2-diphenyl-1H-benzimidazole and 0.418 g of iridium chloride. A mixed solvent of 2-ethoxyethanol and water (3:1) was then added and mixed. Subsequently, the mixture was refluxed at 120° C. for 12 hours under a nitrogen atmosphere and then cooled to room temperature. Water was added to the solution to quench the reaction. The solution was then filtered. The resulting solid was washed with hexane to give a compound of formula 12.

[Chemical Formula 12]

(Formula 12)

The compound of formula 11 was synthesized according to the following procedure. To a 200-ml three-necked flask were added 0.195 g of the compound of formula 12, 0.1 g of a fluoroalkyl-substituted pyridyltriazole derivative, 0.07 g of sodium carbonate, and 10 ml of ethoxyethanol, and refluxed at room temperature for 10 hours under a nitrogen atmosphere. Water was then added to the solution. The solution was filtered, and the resulting solid was washed with hexane. The solid was subjected to silica gel column chromatography with an ethyl acetate/hexane mixed solvent as a developing solvent to give the compound of formula 11. The compound of formula 11 was dissolved in toluene, and the PL spectrum of the solution was measured using excitation ultraviolet light with a wavelength of 335 nm. The measurement showed green emission with a peak wavelength of 500 nm.

<Synthesis of Ir(tb-ptp)2F7taz>

First, a compound of formula 13 (Ir(tb-ptp)2F7taz) as a green dopant was synthesized for the preparation of an organic white light-emitting device according to an example of the present invention.

[Chemical Formula 13]

(Formula 13)

A compound of formula 14 as an intermediate necessary for the synthesis of the compound of formula 13 was synthesized according to the following procedure. To a 200-ml three-necked flask were added 0.934 g of 4-(4-tert-butylphenyl)thieno[3,2-c]pyridine and 0.418 g of iridium chloride. A mixed solvent of 2-ethoxyethanol and water (3:1) was then added and mixed. Subsequently, the mixture was refluxed at 120° C. for 12 hours under a nitrogen atmosphere and then cooled to room temperature. Water was added to the solution to quench the reaction. The solution was then filtered. The resulting solid was washed with hexane to give a compound of formula 14.

[Chemical Formula 14]

(Formula 14)

The compound of formula 13 was synthesized according to the following procedure. To a 200-ml three-necked flask were added 0.198 g of the compound of formula 14, 0.1 g of a fluoroalkyl-substituted pyridyltriazole derivative, 0.07 g of sodium carbonate, and 10 ml of ethoxyethanol, and refluxed at room temperature for 10 hours under a nitrogen atmosphere. Water was then added to the solution. The solution was filtered, and the resulting solid was washed with hexane. The solid was subjected to silica gel column chromatography with an ethyl acetate/hexane mixed solvent as a developing solvent to give the compound of formula 13. The compound of formula 13 was dissolved in toluene, and the PL spectrum of the solution was measured using excitation ultraviolet light with a wavelength of 335 nm. The measurement showed green emission with a peak wavelength of 531 nm.

<Synthesis of Ir(F2ppy)2OcOPhtaz>

First, a compound of formula 15 (Ir(F2ppy)2OcOPhtaz) as a blue dopant was synthesized for the preparation of an organic white light-emitting device according to an example of the present example.

[Chemical Formula 15]

(Formula 15)

A compound of formula 10 as an intermediate necessary for the synthesis of the compound of formula 15 was synthe-sized according to the following procedure. To a 200-ml three-necked flask were added 0.669 g of 2-(2,4-difluorophe-nyl)pyridine and 0.418 g of iridium chloride. A mixed solvent of 2-ethoxyethanol and water (3:1) was then added and mixed. Subsequently, the mixture was refluxed at 120° C. for 12 hours under a nitrogen atmosphere and then cooled to room temperature. Water was added to the solution to quench the reaction. The solution was then filtered. The resulting solid was washed with hexane to give a compound of formula 10.

The compound of formula 15 was synthesized according to the following procedure. To a 200-ml three-necked flask were added 0.151 g of the compound of formula 10, 0.1 g of an alkyl-substituted pyridyltriazole derivative, 0.07 g of sodium carbonate, and 10 ml of ethoxyethanol, and refluxed at room temperature for 10 hours under a nitrogen atmosphere. Water was then added to the solution. The solution was filtered, and the resulting solid was washed with hexane. The solid was subjected to silica gel column chromatography with an ethyl acetate/hexane mixed solvent as a developing solvent to give the compound of formula 15. The compound of formula 15 was dissolved in toluene, and the PL spectrum of the solution was measured using excitation ultraviolet light with a wavelength of 335 nm. The measurement showed blue emission with a peak wavelength of 492 nm.

<Synthesis of Ir(pbi)2OcOPhtaz>

First, a compound of formula 16 (Ir(pbi)2OcOPhtaz) as a green dopant was synthesized for the preparation of an organic white light-emitting device according to an example of the present invention.

[Chemical Formula 16]

(Formula 16)

A compound of formula 12 as an intermediate necessary for the synthesis of the compound of formula 16 was synthe-sized according to the following procedure. To a 200-ml three-necked flask were added 0.946 g of 1,2-diphenyl-1H-benzimidazole and 0.418 g of iridium chloride. A mixed solvent of 2-ethoxyethanol and water (3:1) was then added and mixed. Subsequently, the mixture was refluxed at 120° C. for 12 hours under a nitrogen atmosphere and then cooled to room temperature. Water was added to the solution to quench the reaction. The solution was then filtered. The resulting solid was washed with hexane to give a compound of formula 12.

[Chemical Formula 17]

(Formula 12)

The compound of formula 16 was synthesized according to the following procedure. To a 200-ml three-necked flask were added 0.190 g of the compound of formula 12, 0.1 g of a fluoroalkyl-substituted pyridyltriazole derivative, 0.07 g of sodium carbonate, and 10 ml of ethoxyethanol, and refluxed at room temperature for 10 hours under a nitrogen atmosphere. Water was then added to the solution. The solution was filtered, and the resulting solid was washed with hexane. The solid was subjected to silica gel column chromatography with an ethyl acetate/hexane mixed solvent as a developing solvent to give the compound of formula 16. The compound of formula 16 was dissolved in toluene, and the PL spectrum of the solution was measured using excitation ultraviolet light with a wavelength of 335 nm. The measurement showed green emission with a peak wavelength of 505 nm.

<Synthesis of Ir(tb-ptp)2OcOPhtaz>

First, a compound of formula 17 (Ir(tb-ptp)2cOPhtaz) as a green dopant was synthesized for the preparation of an organic white light-emitting device according to an example of the present invention.

[Chemical Formula 18]

(Formula 17)

A compound of formula 14 as an intermediate necessary for the synthesis of the compound of formula 17 was synthesized according to the following procedure. To a 200-ml three-necked flask were added 0.934 g of 4-(4-tert-butylphenyl)thieno[3,2-c]pyridine and 0.418 g of iridium chloride. A mixed solvent of 2-ethoxyethanol and water (3:1) was then added and mixed. Subsequently, the mixture was refluxed at 120° C. for 12 hours under a nitrogen atmosphere and then cooled to room temperature. Water was added to the solution to quench the reaction. The solution was then filtered. The resulting solid was washed with hexane to give a compound of formula 14.

The compound of formula 17 was synthesized according to the following procedure. To a 200-ml three-necked flask were added 0.189 g of the compound of formula 17, 0.1 g of a fluoroalkyl-substituted pyridyltriazole derivative, 0.07 g of sodium carbonate, and 10 ml of ethoxyethanol, and refluxed at room temperature for 10 hours under a nitrogen atmosphere. Water was then added to the solution. The solution was filtered, and the resulting solid was washed with hexane. The solid was subjected to silica gel column chromatography with an ethyl acetate/hexane mixed solvent as a developing solvent to give the compound of formula 17. The compound of formula 17 was dissolved in toluene, and the PL spectrum of the solution was measured using excitation ultraviolet light with a wavelength of 335 nm. The measurement showed green emission with a peak wavelength of 535 nm.

Example 1

An organic light-emitting device having the structure shown in FIG. 1 was prepared as an example of the present invention. A toluene solution of mCP as a host, FIrpic as a blue dopant, Ir(ppy)3 as a green dopant, and Ir(pq)2F7taz of formula 3 as a red dopant was used as a coating liquid to form the light-emitting layer. The weight ratio between respective materials was 100:10:0.3:0.5. The host and the blue, green, and red dopants were dissolved in toluene to form the coating liquid. The solid concentration of the coating liquid was set at 1 wt %. Using the coating liquid, the organic light-emitting layer was formed by spin coating. Subsequently, a 3TPYMB layer was formed as the electron transport layer by vacuum deposition. A laminated body of LiF and Al was deposited as the upper electrode, so that the organic light-emitting device was obtained.

When a voltage was applied to the prepared organic light-emitting device, emissions from the red, green, and blue dopants were observed in the EL spectrum, and white light emission was observed. The organic light-emitting device according to this example had a luminous efficiency 1.39 times that of the organic light-emitting device of Comparative Example 1. The luminous efficiency higher than that in Example 2 would be because of Ir(ppy)3 with a fluorescence quantum yield higher than that of Ir(pbi)2F7taz.

Example 2

An organic light-emitting device having the structure shown in FIG. 1 was prepared as an example of the present invention. A toluene solution of mCP as a host, FIrpic as a blue dopant, Ir(pbi)2F7taz of formula 11 as a green dopant, and Ir(pq)2F7taz of formula 3 as a red dopant was used as a coating liquid to form the light-emitting layer. The weight ratio between respective materials was 100:10:1:0.5. The host and the blue, green, and red dopants were dissolved in toluene to form the coating liquid. The solid concentration of the coating liquid was set at 1 wt %. Using the coating liquid, the organic light-emitting layer was formed by spin coating. Subsequently, a 3TPYMB layer was formed as the electron transport layer by vacuum deposition. A laminated body of LiF and Al was deposited as the upper electrode, so that the organic light-emitting device was obtained.

When a voltage was applied to the prepared organic light-emitting device, emissions from the red, green, and blue dopants were observed in the EL spectrum, and white light emission was observed. The organic light-emitting device according to this example had a luminous efficiency 1.2 times that of the organic light-emitting device of Comparative Example 1.

Example 3

An organic light-emitting device having the structure shown in FIG. 1 was prepared as an example of the present invention. A toluene solution of mCP as a host, FIrpic as a blue dopant, Ir(pbi)2OcOPhtaz of formula 16 as a green dopant, and Ir(pq)2F7taz of formula 3 as a red dopant was used as a coating liquid to form the light-emitting layer. The weight ratio between respective materials was 100:10:1:0.5. The host and the blue, green, and red dopants were dissolved in toluene to form the coating liquid. The solid concentration of the coating liquid was set at 1 wt %. Using the coating liquid, the organic light-emitting layer was formed by spin coating. Subsequently, a 3TPYMB layer was formed as the electron transport layer by vacuum deposition. A laminated body of LiF and Al was deposited as the upper electrode, so that the organic light-emitting device was obtained.

When a voltage was applied to the prepared organic light-emitting device, emissions from the red, green, and blue dopants were observed in the EL spectrum, and white light emission was observed. The organic light-emitting device according to this example had a luminous efficiency 1.41 times that of the organic light-emitting device of Comparative Example 1.

Example 4

An organic light-emitting device having the structure shown in FIG. 1 was prepared as an example of the present invention. A toluene solution of mCP as a host, FIrpic as a blue dopant, Ir(tb-ptp)2cOPhtaz of formula 17 as a green dopant, and Ir(pq)2F7taz of formula 3 as a red dopant was used as a coating liquid to form the light-emitting layer. The weight ratio between respective materials was 100:10:1:0.5. The host and the blue, green, and red dopants were dissolved in toluene to form the coating liquid. The solid concentration of the coating liquid was set at 1 wt %. Using the coating liquid, the organic light-emitting layer was formed by spin coating. Subsequently, a 3TPYMB layer was formed as the electron transport layer by vacuum deposition. A laminated body of LiF and Al was deposited as the upper electrode, so that the organic light-emitting device was obtained.

When a voltage was applied to the prepared organic light-emitting device, emissions from the red, green, and blue dopants were observed in the EL spectrum, and white light emission was observed. The organic light-emitting device according to this example had a luminous efficiency 1.67 times that of the organic light-emitting device of Comparative Example 1.

Example 5

An organic light-emitting device having the structure shown in FIG. 1 was prepared as an example of the present invention. A toluene solution of mCP as a host, Ir(F2ppy)2OcOPhtaz of formula 15 as a blue dopant, Ir(tb-ptp)2OcOPhtaz of formula 17 as a green dopant, and Ir(pq)2F7taz of formula 3 as a red dopant was used as a coating liquid to form the light-emitting layer. The weight ratio between respective materials was 100:10:1:0.5. The host and the blue, green, and red dopants were dissolved in toluene to form the coating liquid. The solid concentration of the coating liquid was set at 1 wt %. Using the coating liquid, the organic light-emitting layer was formed by spin coating. Subsequently, a 3TPYMB layer was formed as the electron transport layer by vacuum deposition. A laminated body of LiF and Al was deposited as the upper electrode, so that the organic light-emitting device was obtained.

When a voltage was applied to the prepared organic light-emitting device, emissions from the red, green, and blue dopants were observed in the EL spectrum, and white light emission was observed. The organic light-emitting device according to this example had a luminous efficiency 1.8 times that of the organic light-emitting device of Comparative Example 1.

Comparative Example 1

An organic light-emitting device having the structure shown in FIG. 1 was prepared as a comparative example. A toluene solution of mCP as a host, FIrpic as a blue dopant, Ir(ppy)3 as a green dopant, and Ir(piq)2acacF7 of formula 18 as a red dopant was used as a coating liquid to form the light-emitting layer. The weight ratio between respective materials was 100:10:0.3:0.5. The host and the blue, green, and red dopants were dissolved in toluene to form the coating liquid. The solid concentration of the coating liquid was set at 1 wt %. Using the coating liquid, the organic light-emitting layer was formed by spin coating. Subsequently, a 3TPYMB layer was formed as the electron transport layer by vacuum deposition. A laminated body of LiF and Al was deposited as the upper electrode, so that the organic light-emitting device was obtained.

[Chemical Formula 19]

(Formula 18)

When a voltage was applied to the prepared organic light-emitting device, emissions from the red, green, and blue dopants were observed in the EL spectrum, and white light emission was observed. However, the resulting luminous efficiency was lower than that in each example.

The results in the examples and the comparative example are summarized in Table 1.

TABLE 1

| | Host | Blue dopant | Green dopant | Red dopant | Luminous efficiency (vs. Comparative Example 1) |
|---|---|---|---|---|---|
| Example 1 | mCP | FIrpic | Ir(ppy)3 | Ir(pq)2F7taz | 1.39 |
| Example 2 | mCP | FIrpic | Ir(pbi)2F7taz | Ir(pq)2F7taz | 1.2 |
| Example 3 | mCP | FIrpic | Ir(pbi)2OcOPhtaz | Ir(pq)2F7taz | 1.41 |
| Example 4 | mCP | FIrpic | Ir(tb-ptp)2OcOPhtaz | Ir(pq)2F7taz | 1.67 |
| Example 5 | mCP | Ir(F2ppy)2OcOPhtaz | Ir(tb-ptp)2OcOPhtaz | Ir(pq)2F7taz | 1.8 |
| Comparative Example 1 | mCP | FIrpic | Ir(ppy)3 | Ir(piq)2acacF7 | 1 |

REFERENCE SIGNS LIST

1 hole injection layer
2 hole transport layer
3 light-emitting layer
8 electron transport layer
9 electron injection layer
10 substrate
11 lower electrode
12 upper electrode
13 organic layer
104 first bank
105 second bank
106 resin layer
107 sealing substrate
108 light extraction layer

The invention claimed is:

1. An organic light-emitting device, comprising: an upper electrode; a lower electrode; and a light-emitting layer disposed between the upper electrode and the lower electrode, wherein the light-emitting layer comprises a host and a first dopant, the first dopant comprises a pyridyltriazole derivative as an auxiliary ligand, the auxiliary ligand of the first dopant contains a functional group $R_1$ or a functional group $R_2$, and the first dopant is displaced toward a surface of the light emitting layer by the action of at least one of the functional groups $R_1$ and $R_2$, wherein the surface is on a side where the upper electrode is present, the light-emitting layer further comprises a second dopant, and an emission wavelength of the first dopant is different from that of the second dopant, $R_1$ represents at least one of hydrogen, a halogen element, a fluoroalkyl group, a perfluoroalkyl group, an alkyl group (having at least 8 carbon atoms), a perfluoropolyether group, and a siloxy group, and $R_2$ represents at least one of a fluoroalkyl group, a perfluoroalkyl group, an alkyl group (having at least 8 carbon atoms), a perfluoropolyether group, and a siloxy group.

2. The organic light-emitting device according to claim 1, wherein the first dopant is a compound represented by formula 1:

[Chemical Formula 1]

(Formula 1)

wherein Ar1 and Ar2 each represent an aromatic heterocyclic ring or an aromatic hydrocarbon ring, and
element M represents any element in Group 8, 9, or 10 of the periodic table.

3. The organic light-emitting device according to claim 2, wherein the element M is iridium.

4. The organic light-emitting device according to claim 1, wherein the second dopant comprises a pyridyltriazole derivative as an auxiliary ligand, the auxiliary ligand of the second dopant contains a functional group, and the second dopant is displaced toward a surface of the light-emitting layer by the action of the functional group in the auxiliary ligand of the second dopant, wherein the surface is on a side where the upper electrode is present.

5. The organic light-emitting device according to claim 4, wherein the light-emitting layer further comprises a third dopant, and an emission color of the third dopant is different from that of the first dopant and that of the second dopant.

6. The organic light-emitting device according to claim 5, wherein the third dopant has an emission wavelength longer than that of the second dopant, the third dopant comprises a pyridyltriazole derivative as an auxiliary ligand, the auxiliary ligand of the third dopant contains a functional group, and the third dopant is displaced toward a surface of the light-emitting layer by the action of the functional group in the auxiliary ligand of the third dopant, wherein the surface is on a side where the upper electrode is present.

7. The organic light-emitting device according to claim 1, wherein the first dopant is a red dopant.

8. The organic light-emitting device according to claim 1, wherein in a thicknesswise direction of the light-emitting layer, the concentration of the first dopant reaches a peak at a location shifted from a center of the light-emitting layer toward the upper electrode, and in the thicknesswise direction of the light-emitting layer, the concentration of the first dopant monotonously decreases from the location where the concentration of the first dopant reaches a peak toward the lower electrode.

9. A coating liquid for use in forming the light-emitting layer of the organic light-emitting device according to claim 1, the coating liquid comprising a solvent, the host, and the first dopant.

10. A method for manufacturing an organic light-emitting device comprising an upper electrode, a lower electrode, and a light-emitting layer disposed between the upper electrode and the lower electrode, the method comprising: forming the light-emitting layer by a coating process, wherein the light-emitting layer comprises a host and a first dopant, the first dopant comprises a pyridyltriazole derivative as an auxiliary ligand, the auxiliary ligand of the first dopant contains a functional group $R_1$ or a functional group $R_2$, and the first dopant is displaced toward a surface of the light emitting layer by the action of at least one of the functional groups $R_1$ and $R_2$, wherein the surface is on a side where the upper electrode is present, the light-emitting layer further comprises a second dopant, an emission wavelength of the first dopant is different from that of the second dopant, $R_1$ represents at least one of hydrogen, a halogen element, a fluoroalkyl group, a perfluoroalkyl group, an alkyl group (having at least 8 carbon atoms), a perfluoropolyether group, and a siloxy group, and $R_2$ represents at least one of a fluoroalkyl group, a perfluoroalkyl group, an alkyl group (having at least 8 carbon atoms), a perfluoropolyether group, and a siloxy group.

* * * * *